(12) United States Patent
Zhou et al.

(10) Patent No.: US 7,317,333 B1
(45) Date of Patent: Jan. 8, 2008

(54) LARGE LOADING SPLIT I/O DRIVER WITH NEGLIGIBLE CROWBAR

(75) Inventors: Shi-dong Zhou, Milpitas, CA (US); Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 177 days.

(21) Appl. No.: 11/055,228

(22) Filed: Feb. 10, 2005

(51) Int. Cl.
*H03K 19/0175* (2006.01)

(52) U.S. Cl. .................... 326/80; 326/81; 326/86; 326/87; 327/109; 327/333

(58) Field of Classification Search ............ 326/26–27, 326/80–83, 86–87; 327/108–109, 333
See application file for complete search history.

(56) References Cited

U.S. PATENT DOCUMENTS

| | | | | |
|---|---|---|---|---|
| 4,779,013 | A | * | 10/1988 | Tanaka ..................... 326/27 |
| 5,097,152 | A | * | 3/1992 | Kohda et al. ................ 326/80 |
| 5,165,046 | A | | 11/1992 | Hesson |
| 5,528,166 | A | * | 6/1996 | Iikbahar ..................... 326/27 |
| 6,066,958 | A | * | 5/2000 | Taniguchi et al. ........... 326/27 |
| 6,208,167 | B1 | * | 3/2001 | Ranjan et al. ............... 326/81 |
| 6,578,156 | B1 | * | 6/2003 | Sugita ...................... 713/502 |
| 2005/0024090 | A1 | * | 2/2005 | Terletzki et al. ............ 326/27 |

OTHER PUBLICATIONS

Rhyne Fundamentals of Digital System Design, 1973, N.J., pp. 70-71.*

* cited by examiner

*Primary Examiner*—Rexford Barnie
*Assistant Examiner*—Jason Crawford
(74) *Attorney, Agent, or Firm*—Thomas A. Ward; Kin-Wah Tong

(57) ABSTRACT

A pre-driver for large I/O pull-up and pull-down transistors is provided so that the I/O pull-up and pull-down transistors do not experience crowbar current, and the pre-driver circuit likewise does not experience crowbar current or require large driver transistors. One pre-driver circuit includes two NAND gates and two NOR gates with delay circuitry provided by two series inverters from a data input to a first node, and two additional series inverters from the first node to a second node. A further pre-driver circuit includes feedback from the pre-driver outputs to ensure its NMOS and PMOS transistors do not turn on together to create crowbar, while allowing faster switching. With the pre-driver circuit embodiments, a conventional level shifter can be used. Further with the pre-driver circuitry, slew rate control can be provided in the pull-up and pull-down driver circuitry, rather than in the pre-driver circuitry.

17 Claims, 8 Drawing Sheets

FIG. 14

LARGE LOADING SPLIT I/O DRIVER WITH NEGLIGIBLE CROWBAR

BACKGROUND

1. Technical Field

The present invention relates to a circuit for driving pull-up and pull-down transistors of an I/O buffer in an integrated circuit (IC). More particularly, the present invention relates to an I/O driver circuit with components to prevent crowbar current occurring when both the pull-up and pull-down transistor are momentarily turned on together during a transition of the I/O buffer.

2. Related Art

Figure 1:
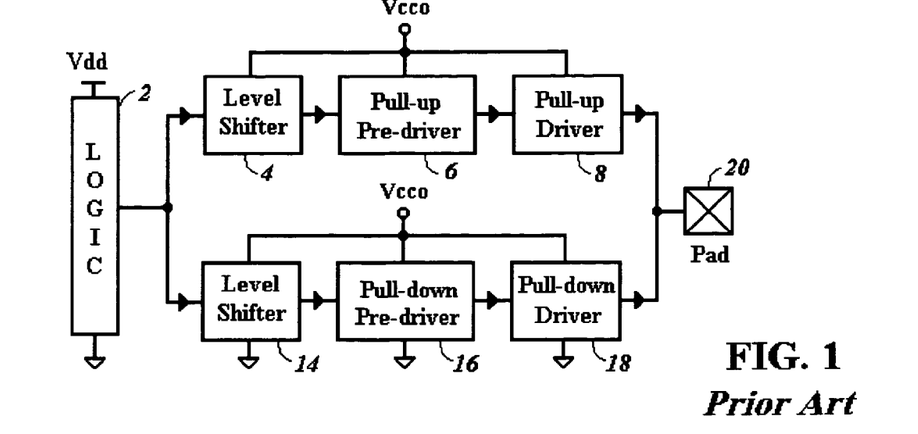
FIG. 1 shows a block diagram of typical components of an I/O driver.

FIG. 1 shows a block diagram of typical components of an I/O driver. The I/O driver circuitry is shown providing an output from logic 2 of an IC. The I/O driver is illustrated with logic circuitry 2, such as that provided in a Complex Programmable Logic Device (CPLD) or an Field Programmable Gate Array (FPGA), although a similar I/O driver can be used with other circuit types, such as a microprocessor or an ASIC.

The I/O driver circuit shown in FIG. 1 initially includes level shifters 4 and 14 for transitioning a voltage level from Vdd, provided to logic 2, to Vcco, provided to the output pad 20, to make the IC compatible with other chips that operate at different voltage levels. The level shifter 4 is provided to shut off completely any PMOS transistor in the pull-up pre-driver, while the level shifter 14 is provided to match the timing of the pull-up pre-driver 6 relative to the pull-down pre-driver 16 when Vcco is significantly higher than Vdd. The level shifters 4 and 14 are provided to make the IC compatible with other chips that operate at different voltage levels. For example, the internal logic 2 may operate at 2.5 volts, while the pad 20 is connected to a chip with input voltage requirements of 3.0 volts or 5.0 volts. If the IC containing the logic 2 is only designed to operate with components operating at the same voltage level, the level shifters 4 and 14 are not needed.

The I/O driver circuitry further includes pull-up and pull-down pre-driver circuits 6 and 16 that function to apply appropriate voltage level and provide appropriate current capacity to transistors in the pull-up driver 8 and pull-down driver 18 so that the signal on the pad 20 has HI and LO transitions corresponding with the data signal provided from the logic 2. The pull-up and pull-down pre-driver circuits 6 and 16 also function to transition transistors in the pull-up and pull-down drivers 8 and 18 so that crowbar current does not occur.

Figure 2:
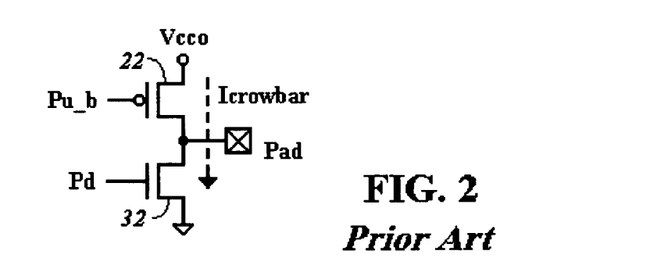
FIG. 2 shows one embodiment of the pull-up and pull-down transistors for the I/O drivers of FIG. 1.

The pull-up and pull-down driver circuits 8 and 18 can be as simple as shown in FIG. 2. The PMOS pull-up transistor 22 forms the pull-up driver 8, while the NMOS pull-down transistor 32 forms the pull-down driver 18 of FIG. 1. The pull-up and pull-down driver transistors 22 and 32 are typically large in size in order to drive the pad and to sink or source current required for an IC device. However, if the signals Pu_b and Pd change at the same time, there is a moment that both the PMOS transistor 22 and NMOS transistor 32 are ON that momentarily causes an unwanted crowbar current, labeled Icrowbar, to flow directly from Vcco to Gnd. Not only does Icrowbar waste power, it also causes Vcco and ground bounce.

Figure 3:
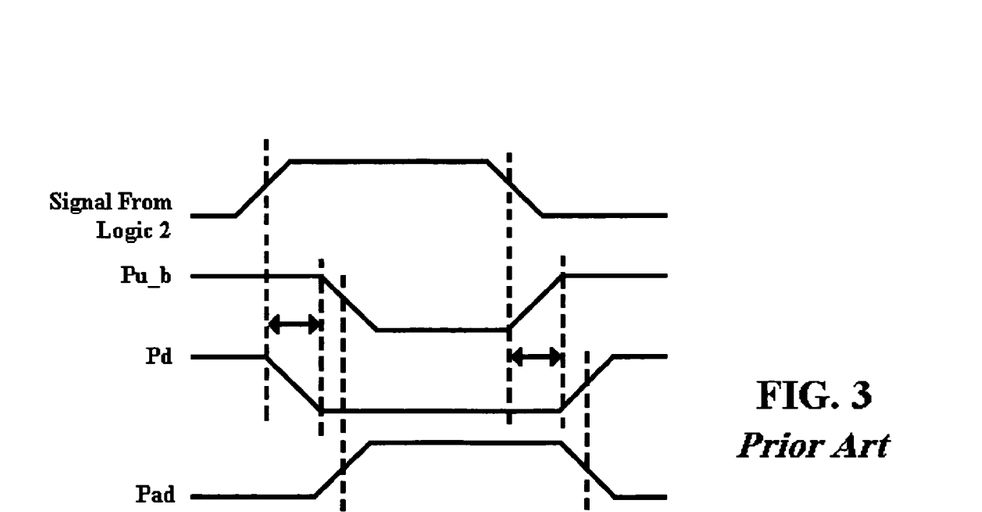
FIG. 3 shows a timing diagram for driving the pull-up and pull-down transistors of FIG. 2.

To eliminate crowbar, Pu_b and Pd are generated by pre-driver circuits 6 and 16 of FIG. 1 without a transition overlap, as shown in FIG. 3. In FIG. 3 with the signal from logic 2 being LO for some time, Pu_b is HI turning off PMOS transistor 22, while Pd is HI turning on NMOS driver transistor 32 to drive the pad LO. With a transition of the signal from logic 2 to a HI, Pd initially goes LO to turn off NMOS transistor 32 first before Pu_b goes LO to turn on PMOS transistor 22 so that transistors 22 and 32 are not on together. Pu_b transitioning to LO turns on PMOS transistor 22 and drives the pad HI. When the signal from logic 2 transitions back to LO, Pu_b initially goes HI to turn off PMOS transistor 22 before Pd goes HI to turn on NMOS transistor 32 so that transistors 22 and 32 again are not on together. Pd transitioning to HI turns on NMOS transistor 32 and drives the pad LO.

Figure 4:
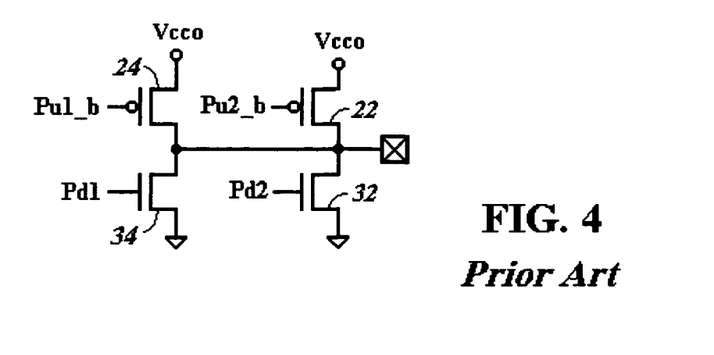
FIG. 4 shows another embodiment of the pull-up and pull-down driver circuits of FIG. 1 to provide both AC and DC buffers.

Another configuration for a pull-up and pull-down drivers 8 and 18 is shown in FIG. 4. In FIG. 4, the pull-up and pull-down drivers are split into AC and DC driver portions. The AC driver transistors 24 and 34 would turn on quickly first before a later turn on of the DC driver transistors 22 and 32. The AC driver is used to meet rapid rise and fall time specifications, and typically use smaller transistors. The DC driver transistors are much larger to sustain driving a large load on the pad once a transition occurs. The larger DC driver transistors would transition slower, based on their size, and are turned on only to sustain a large load after transitioning. With rapid transitioning of the AC drivers, the DC driver transistors could potentially remain off. If only one set of driver transistors are desired and rapid transition specifications are not needed, the large DC transistors 22 and 32 are used alone as shown in FIG. 2. FIG. 4 adds the AC PMOS pull-up transistor 24 and NMOS pull-down transistor 34. For convenience, components carried over from FIG. 2 to FIG. 4 are similarly labeled, as will be components carried over in subsequent drawings. In some versions of a split AC and DC driver, the AC pull-up transistor 24 is an NMOS device which provides a more rapid transition than a PMOS device, while the DC pull-up transistor 22 remains a PMOS device which does not experience a transistor threshold drop of an NMOS transistor.

Figure 5:
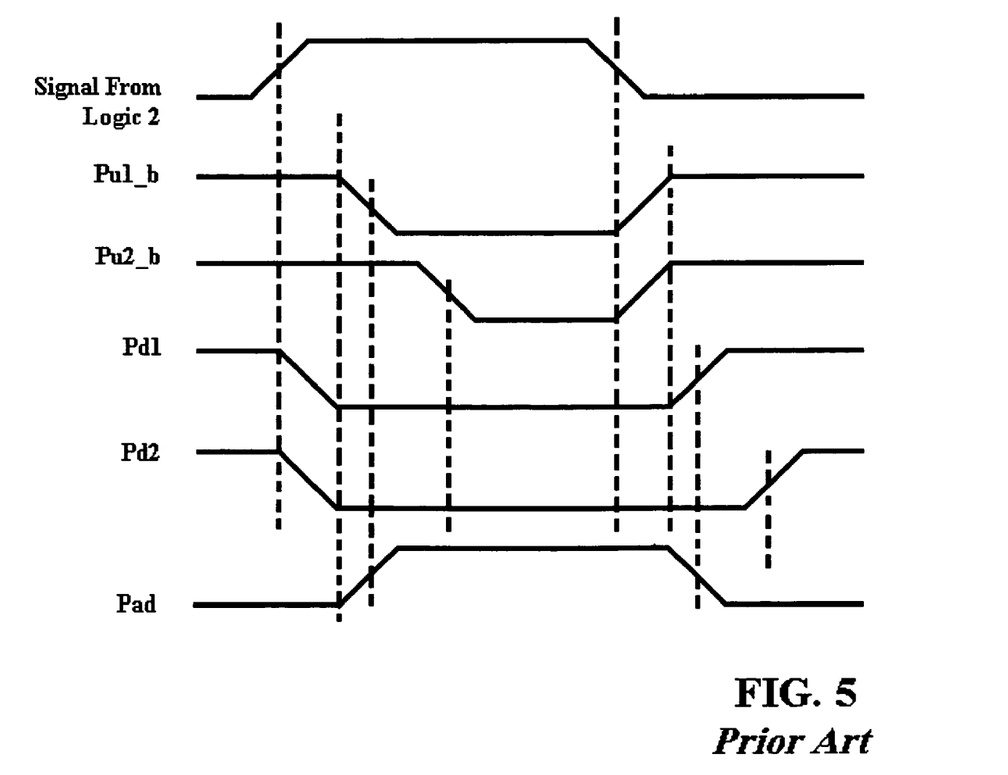
FIG. 5 shows a timing diagram for driving the pull-up and pull-down transistors of FIG. 4.

The preferred timing for the components of FIG. 4 is illustrated in FIG. 5. In FIG. 5 with the signal from logic 2 being LO for some time, Pu_1b and Pu2b are HI turning off PMOS transistors 22 and 24, while Pd1 and Pd2 are HI turning on NMOS transistors 32 and 34 to maintain the pad LO. With a transition of logic 2 to a HI, Pd1 and Pd2 initially go LO together to turn off NMOS transistors 32 and 34 before either of Pu_1b or Pu2_b go LO to turn on PMOS transistors 22 and 24. Similar to the Pu_b and Pd signals of FIG. 3, the signals Pd1, Pd2, Pu_1b and Pu_2b of FIG. 5 are provided to ensure that none of the PMOS and NMOS transistors turn on together to prevent crowbar current. So, the AC driver PMOS transistor 24 is turned on by Pu_1b going LO after Pd1 and Pd2 are LO (turning off both the NMOS transistors 32 and 34). Pu_1b driving the AC PMOS transistor 24 first ensures a fast rise time on the pad relative to FIG. 3. Pu_2b transitions later than Pu_1b to sustain the pad HI with the large DC PMOS driver transistor 24. When the signal from logic 2 transitions back to LO, Pu_1b and Pu_2b initially go HI together. To prevent crowbar, Pd1 and Pd2 do not begin to go HI to turn on the NMOS transistors 32 and 34 until after the PMOS transistors 22 and 24 are fully off due to Pu_1b and Pu_2b. Pd1 initially goes HI to turn on the AC driver NMOS transistor 34 first, while Pd2 transitions to HI later to sustain the pad LO using DC driver NMOS transistor 32.

The level shifter circuits 4 and 14 and pre-driver circuits 6 and 16 of FIG. 1, which provide the voltages shown in FIG. 5, are very challenging to implement. Many IC designers have achieved providing the voltages using circuitry that trades off the crowbar current in the I/O drivers 8 and 18 with some crowbar current generated in the level shifter 4 and 14 and in the pre-drivers 6 and 16 instead.

Figure 6:
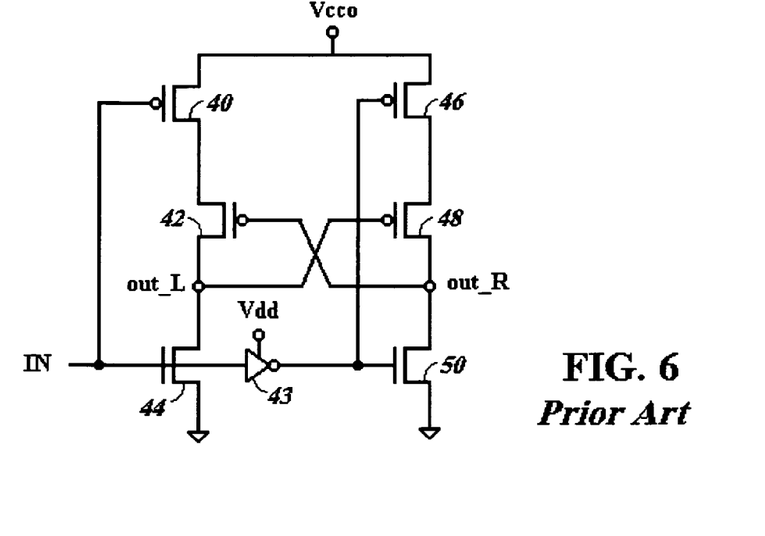
FIG. 6 shows a typical configuration of circuitry for the level shifters of FIG. 1.
Figure 7:
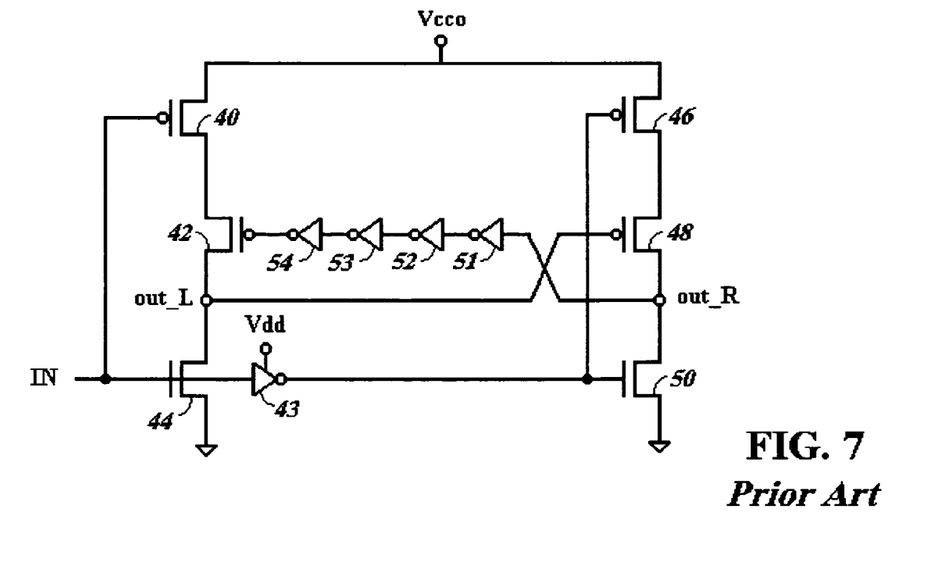
FIG. 7 shows a configuration for the level shifters modified from FIG. 6 to prevent crowbar when generating signals as shown in FIG. 5.

FIG. 6 shows a typical configuration of circuitry for level shifters 4 and 14 of FIG. 1, while FIG. 7 shows a configuration for the level shifters 4 and 14 modified to prevent crowbar current in the I/O drivers 8 and 18 at the expense of some crowbar current created in the level shifters 4 and 14. In FIG. 6, the input signal IN (provided from logic circuit 2 at voltage Vdd) is directed to the gates of NMOS transistors 40 and 44 of a cross coupled differential amplifier that are at voltage level Vcco needed at the pad. The input signal is further provided through an inverter 43 supplied at Vdd to the gates of PMOS transistors 46 and 50. The drains of PMOS transistors 42 and 48 provide complementary outputs out_R and out_L from the level shifter.

In operation with the circuit of FIG. 6, when IN transitions from HI to LO (Vdd to 0), the gate of transistor 46 at the output of inverter 43 shifts from LO to Hi to turn transistor 46 partially off, therefore weakening the pull up on node out_R via transistor 48, which remains ON (since out_L was 0V). Thus, the NMOS transistor 50 has to be big enough to win over the weakened pull-up by transistors 46 and 48 to pull out_R to at least one threshold voltage (Vtp) of transistor 42 below Vcco in order to turn on transistor 42. Once transistor 42 turns ON, a positive feedback kicks in to pull out_L to Vcco and out_R to 0V via transistor 40, which is on due to IN being LO. As designed, the circuit of FIG. 6 allows for transitioning of out_R and out_L in response to a transition of IN with little or no crowbar current.

FIG. 7 modifies FIG. 6 by adding inverters 51-54 connected from out_R to the gate of transistor 42. The added inverters 51-54 provide a switching delay to prevent crowbar in subsequent pre-driver or pull-up driver circuits that might otherwise experience crowbar when modified to provide faster switching. The design of FIG. 7 further enables the level shifter to assist the pull-up and pull-down drivers 8 and 18 in driving large loads.

For operation of the circuitry of FIG. 7, IN is initially assumed to be LO. With IN LO, the output of inverter 54 is LO and out_L remains HI. When IN transitions to HI, the following events occur. First, NMOS transistor 44 turns on immediately. Since IN is only Vdd, the PMOS transistor 40 never shuts off completely. Transistor 42 remains on until out_R goes to HI (Vcco) after the four inverter delay through inverters 51-54. Thus, there is a crowbar current every time IN transitions from LO to HI for approximately the 4-inverter delay. The crowbar current occurring every time IN transitions from LO to HI due to the 4-inverter delay will create a significant current drain on the power supply since there may be hundreds of I/Os or more per chip.

Figure 8:
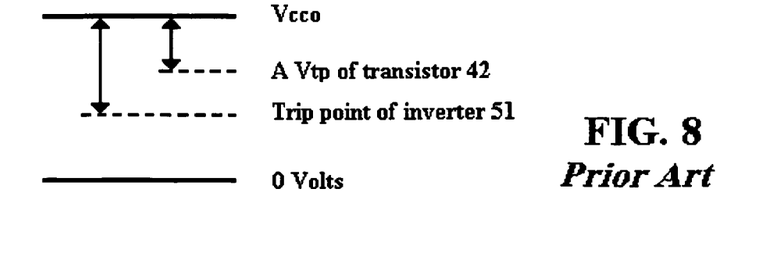
FIG. 8 illustrates the voltage difference needed for transistors of FIG. 7 to level shift between Vdd and Vcco.

In addition to the crowbar current created, larger transistors are required for operation of the circuitry of FIG. 7 For the level shifter with four inverter delays in FIG. 7, transistor 50 needs to pull out_R to a voltage that is below the trip point of inverter 51. Since the trip point of inverter 51 is normally a voltage lower than a Vtp drop of transistor 42 from Vcco, transistor 50 must be bigger in order for the level shifter to function properly. FIG. 8 illustrates the voltage difference needed for transistor 50 (which must now be made significantly larger) to pull down from Vcco a Vtp of transistor 42, along with the trip point of inverter 51.

Figure 9:
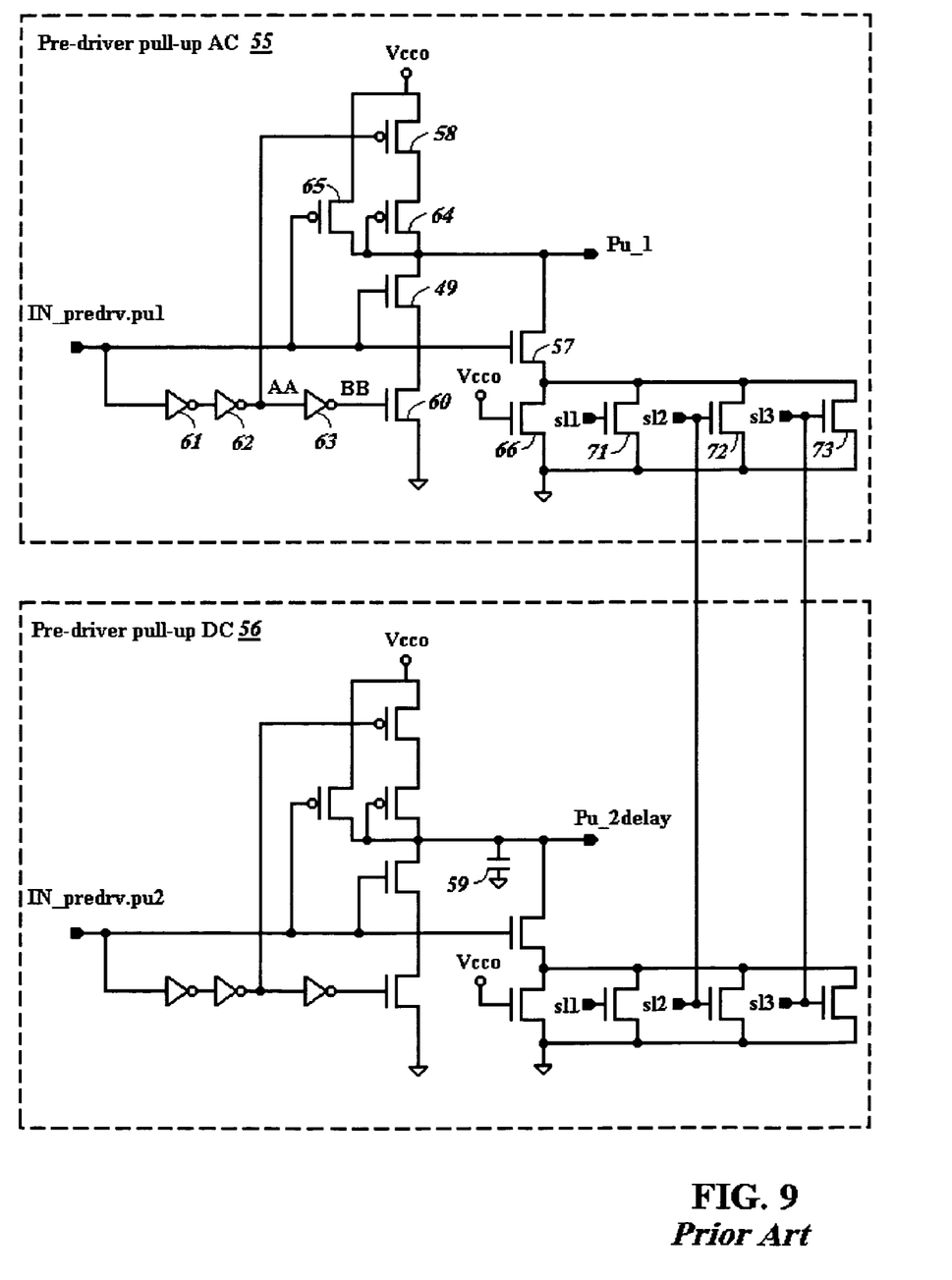
FIGS. 9 and 10 show circuitry for a conventional pre-driver.
Figure 10:
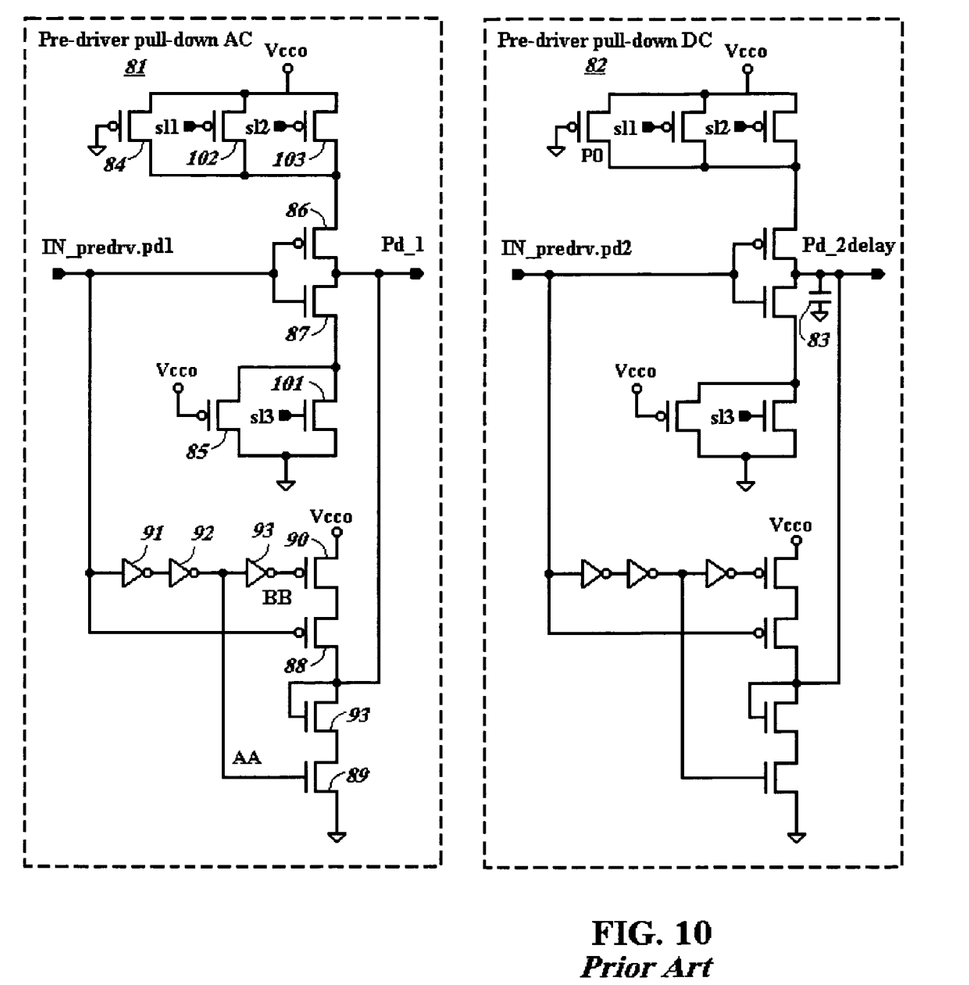

FIGS. 9 and 10 show circuitry for a conventional pre-drivers 6 and 16. FIG. 9 shows the pull-up portion of the pre-driver 6 of FIG. 1, while FIG. 10 shows the pull-down portion of the pre-driver 16 with both pre-driver circuits configured to drive both an AC I/O driver and a DC I/O driver. Input signals to the pre-driver circuits are shown as separate inputs (IN_predrv.pu1, IN_predrv.pu2, IN_predrv.pd1, IN_predrv.pd2) that may be controlled by separate level shifting circuits, although a single input (IN) can be used to drive all of the pre-driver circuits together.

In the pull-up pre-driver structure of FIG. 9, the top circuitry 55 for driving the AC pull-up with the signal Pu_1 is the same as the bottom circuit 56 for driving the DC pull-up with the signal Pu_2delay, except the capacitor 59 providing a delay in the bottom circuitry, so components and operation will be described with respect to the circuit 55.

In operation with the input signal IN_predrv.pu1 LO for some time, NMOS transistors 49 and 57 will be off, node AA will be LO, PMOS transistor 58 will be on, node BB will be HI and NMOS transistor 60 will be on. With the input signal IN_predrv.pu1 to pre-driver 55 transitioning to HI, there will be a path created for crowbar current resulting from the delays created using inverters 61-63 at points AA and BB. The crowbar path is based on M going HI slightly before BB goes LO. The crowbar path is through PMOS transistors 58 and 64 and NMOS transistors 49 and 60 to ground as well as through PMOS transistors 58 and 64 and NMOS transistors 57 and 66 to ground.

Slew rate is controlled by the signals sl1-sl3 applied at the gates of transistors 71-73. The more of the transistors 71-73 that are turned on, the faster the slew rate. Note that with more of the transistors 71-73 turned on in combination with NMOS transistor 57, the more crowbar current created. The slew rate control is somewhat compromised since the control is implemented one stage removed from the actual I/O output stage.

In the pull-down pre-driver structure of FIG. 10, the left circuit 81 for driving the AC pull-down with the signal Pd_1 is the same as the right circuit 82 for driving the DC pull-down with the signal Pd_2delay, except the capacitor 83 providing a delay in the DC circuit 82, so components and operation will be described with respect to the to circuit 81.

In operation, the transistors 84 and 85 will always be on. With the input signal IN_predrv.pd1 HI for some time, PMOS transistors 86 and 88 will be off, node AA will be HI, NMOS transistors 87 and 89 will be on, BB will be LO and PMOS transistor 90 will be on. With the input signal IN_predrv.pd1 to pre-driver 81 transitioning to LO, there will be a path created for crowbar current resulting from the delays created using inverters 91-93 at points M and BB. The crowbar path is based on AA going LO slightly before BB goes HI. The crowbar path is through PMOS transistors 84 and 86 and NMOS transistors 89 and 93 to ground as well as through PMOS transistors 88 and 90 and NMOS transistors 89 and 93 to ground.

Slew rate is controlled by the signals sl1-sl3 applied at the gates of transistors 101-103. As with the pull-up pre-drivers of FIG. 9, the more slew rate control transistors turned on, the faster the slew rate. Further, as with FIG. 9, the slew rate control in FIG. 10 is somewhat compromised since the control is implemented in the pre-driver stage.

With hundreds of both the pull-up and pull-down pre-driver circuits creating crowbar current in an IC, significant power will be drained. It would be desirable to have a pre-driver circuit as well as a level shifter that prevents crowbar in pull-up and pull-down drivers, while not experiencing a trade-off of crowbar in the pre-driver or level shifter circuitry and without requiring large transistors.

SUMMARY

In accordance with embodiments of the present invention, an I/O pre-driver circuit is provided without the trade-off of crowbar current created in a level shifter or pre-driver circuit. Similarly, embodiments of the present invention do not require large transistors in the pre-driver or level shifters.

In one embodiment of the present invention, the pre-driver includes a NAND gate, a NOR gate, and a delay circuit for delaying an input signal. The logic gates receive the input signal and the output of the delay circuit, and provide outputs for driving a pull-up and a pull-down device of an I/O driver. In some embodiments, the pre-driver includes two NAND gates and two NOR gates. A first NAND gate has an output for driving an AC pull-up transistor of the I/O driver, and a second NAND gate has an output for driving a DC pull-up transistor of the I/O driver. A first NOR gate has an output for driving an AC pull-down transistor of the I/O driver, and a second NOR gate then has an output for driving the DC pull-down transistor of the I/O driver.

In a further embodiment of the present invention, feedback from the pre-driver outputs is used to ensure that series-connected NMOS and PMOS transistors do not turn on together. The circuitry for this further embodiment may include three NAND gates, three NOR gates, and delay circuitry. In the circuit, a first NAND gate has an output for driving an AC pull-up transistor of the I/O driver, while the second NAND gate has an output for driving the DC pull-up transistor. The first NOR gate has an output for driving an AC pull-down transistor of the I/O driver, while the second NOR gate has an output for driving the DC pull-down transistor. Outputs of the first and second NAND gates are provided in a feedback path to inputs of the third NAND gate, while outputs of the first and second NOR gates are provided in a feedback path to inputs of the third NOR gate. The two inputs of the first NAND gate are provided by an input signal IN and the output of the third NOR gate, while the two inputs of the second NAND gate are provided by IN and the output of the third NOR gate through delay circuitry. The two inputs of the first NOR gate are provided by IN and the output of the third NAND gate, while the two inputs of the second NOR gate are provided by IN and the output of the third NAND gate through delay circuitry.

With embodiments of the pre-driver circuit of the present invention, slew rate control can be provided with the pull-up and pull-down driver transistors to provide significantly better slew rate control than using slew rate control in the pre-driver which is compromised by driving the large pull-up and pull-down transistors. Further with such a pre-driver, conventional level shifter circuitry can be used without circuitry creating crowbar current.

BRIEF DESCRIPTION OF THE DRAWINGS

Further details of the present invention are explained with the help of the attached drawings in which.

DETAILED DESCRIPTION

Figure 11:
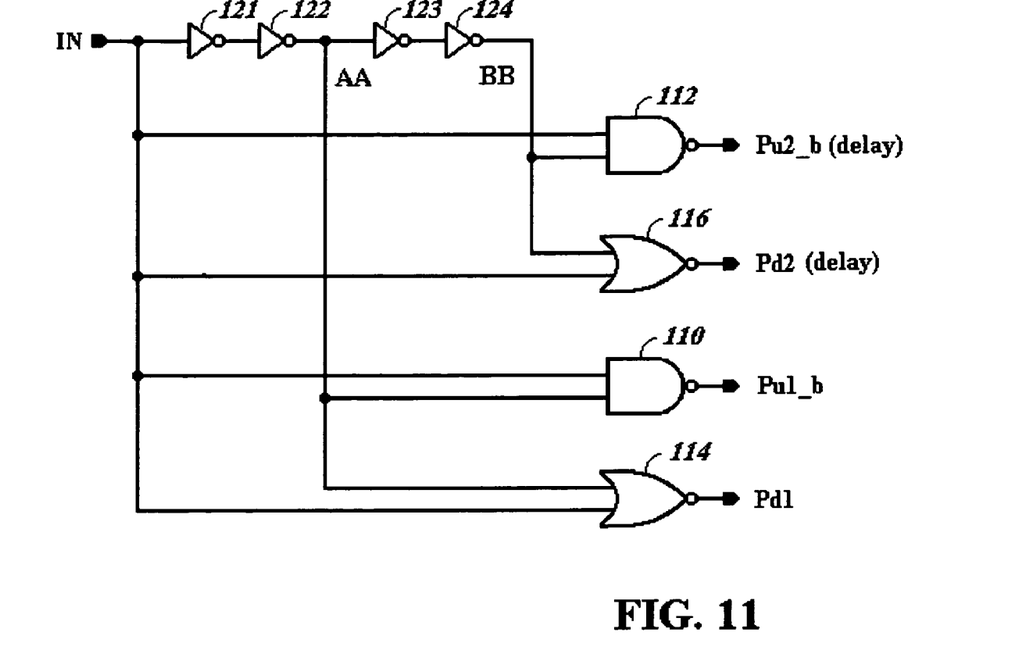
FIG. 11 shows circuitry of a pre-driver in accordance with an embodiment of the present invention.

FIG. 11 shows components of a pre-driver in accordance with an embodiment of the present invention. As shown, the pre-driver includes two NAND gates 110 and 112 and two NOR gates 114 and 116 with delay circuitry provided by two series inverters 121-122 from a data input (IN) to a node AA, and two additional series inverters 123-124 from node AA to a node BB. Although shown as series inverters, the delay provided by inverters 121-122 can be provided using other known elements such as a pass gate or a long section of transmission line. Similarly, the delay and signal inversion provided by inverters 123-124 can be provided by delay elements such as pass gates, along with an inverter or other logic such as a NAND gate with one input HI to create an inversion. Although two inverter pairs 121-122 and 123-124 are shown, additional series inverters can be used as long as the pairs 121-122 and 123-124 are substituted with an even number of inverters. Likewise, although the NOR and NAND gates are shown, other components that provide equivalent functions may be used. For instance the NOR gate can be replaced by an OR gate with an inverted output. Similar replacement of logic components can be made in further embodiments of the present invention as described subsequently herein.

The first NAND gate 110 has an output Pu1_b for driving an AC PMOS pull-up I/O driver transistor (such as 24 of FIG. 4), and has inputs provided by the data input IN and node AA. A second NAND 112 gate has an output Pu2_b for driving a DC PMOS pull-up I/O driver transistor (such as 22 of FIG. 4), and has inputs provided by IN and node BB. A first NOR gate 114 has an output Pd1 for driving an AC NMOS pull-down I/O transistor, and has inputs provided by IN and the node AA. A second NOR gate 116 then has an output for driving the DC NMOS pull-down I/O driver transistor, and has inputs provided by IN and node BB. To limit crowbar current in the NAND gates, a pull up driver transistor in the NAND gate circuitry receiving a delayed input is made with a cross section having a minimal width but a long length. Similarly, to limit crowbar current in the NOR gates, a pull down driver transistor in the NOR gate circuitry receiving a delayed input is made with a cross section having minimal width but a long length.

The timing diagram for the pre-driver components of FIG. 11 is the same as that shown in FIG. 5. However, unlike with pre-driver circuitry previously discussed, there is no crowbar as a trade-off in the pre-driver components of FIG. 11, nor are they required if a level shifter is used.

Figure 12:
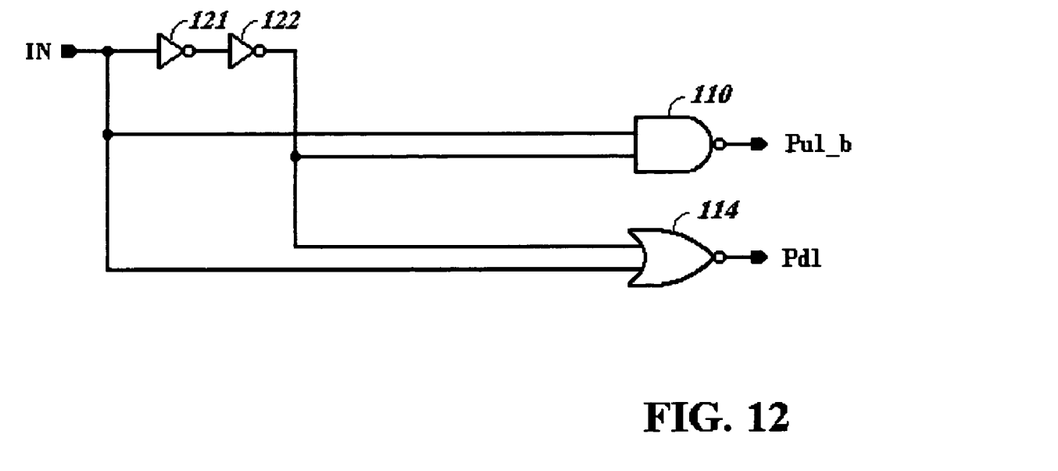
FIG. 12 shows modification to circuitry of the pre-driver of FIG. 11 for use with an I/O driver having single pull-up and pull-down transistors.

FIG. 12 illustrates an embodiment of the pre-driver of the present invention when only DC I/O drivers and no AC I/O drivers are required. FIG. 12 modifies FIG. 11 by removing the NOR gate 112 and NAND gate 116 along with the inverters 123-124.

Figure 13:
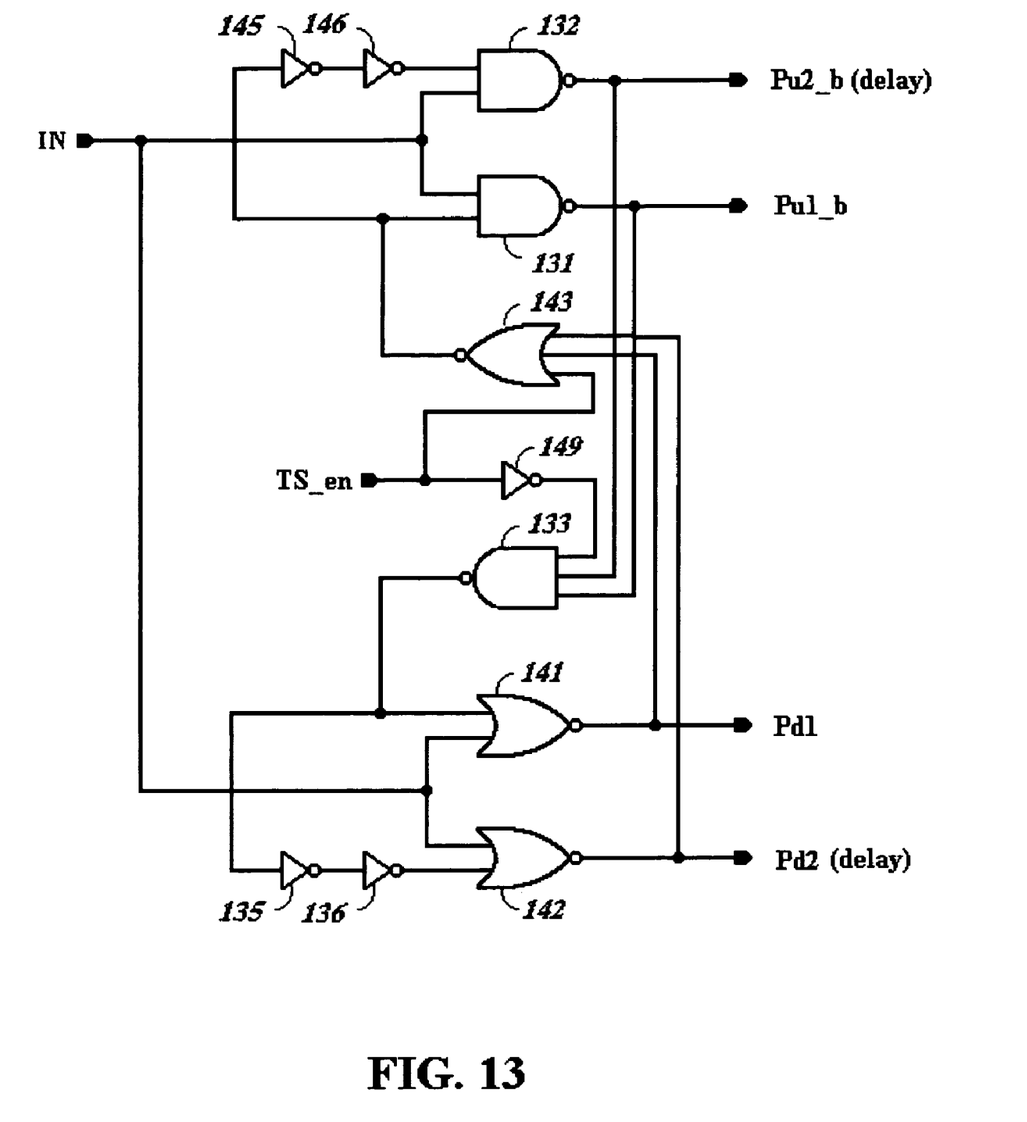
FIG. 13 shows circuitry of a pre-driver in accordance with an embodiment of the present invention with feedback from the pre-driver outputs for fast switching.

FIG. 13 shows components of an embodiment of a pre-driver according to the present invention, with feedback from the pre-driver outputs to ensure that the NMOS and PMOS transistors do not turn on together to create crowbar. With feedback, transitioning of the outputs without crowbar current can be accomplished at a higher speed than with the circuitry of FIGS. 11 and 12.

The components of FIG. 13 include three NAND gates 131-133 and three NOR gates 141-143 with delay circuitry provided by a first two series inverters 135-136, and a second two series inverters 145-146. In the circuit, a first NAND gate 131 has an output Pu1_b for driving an AC PMOS pull-up transistor of the I/O driver (such as 24 of FIG. 4), while the second NAND gate 132 has an output Pu2_b for driving a DC PMOS pull-up transistor. The first NOR gate 141 has an output Pd1 for driving an AC NMOS pull-down transistor of the I/O driver, while the second NOR gate 142 has an output Pd2 for driving the DC NMOS pull-down transistor. Outputs of the first and second NAND gates 131 and 132 are provided in a feedback path to inputs of the third NAND gate 133, while outputs of the first and second NOR gates 141 and 142 are provided in a feedback path to inputs of the third NOR gate 143. The two inputs of the first NAND 131 gate are provided by IN and the output of the third NOR gate 143, while the two inputs of the second NAND gate 132 are provided by IN and the output of the third NOR gate 143 through the two series inverters 145-146. The two inputs of the first NOR gate 141 are provided by IN and the output of the third NAND gate 133, while the two inputs of the second NOR gate 142 are provided by IN and the output of the third NAND gate 133 through two series inverters 135-136.

In one embodiment, the pre-driver of FIG. 13 is provided with a tri-state (TS_en) input to enable tri-stating of the outputs of the pre-driver if desired. Tri-stating is accomplished by providing a tri-state input as a third input to the NAND gate 133 and the NOR gate 143 in the feedback path. The third input of NOR gate 143 is provided directly by the tri-state enable signal TS_en, while the third input of NAND gate 133 is provided by the tri-state enable through an inverter 149. Tri-stating can be similarly accomplished in the circuitry of FIGS. 11-12 by providing a third input to the NAND and NOR gates providing the circuit outputs, with the tri state input provided directly to the NOR gates and through an inverter to the NAND gates.

The pre-driver circuitry of FIGS. 11, 12 or 13 can be preceded by a level shifter circuit as shown in FIG. 6 without the inverter delays of the level shifter circuit of FIG. 7. Although shown in FIG. 1 with the level circuitry proceeding the pre-driver circuitry, the level shifter circuitry can likewise be provided subsequent to the pre-driver circuitry between the pre-driver and I/O driver circuits. With subsequent level shifter circuitry, and multiple outputs from the pre-driver circuits in FIGS. 11, 12 and 13, multiple level shifter circuits like the one shown in FIG. 6 can be used to connect between each separate output and the gates of the pull-up and pull-down I/O driver transistors.

Figure 14:
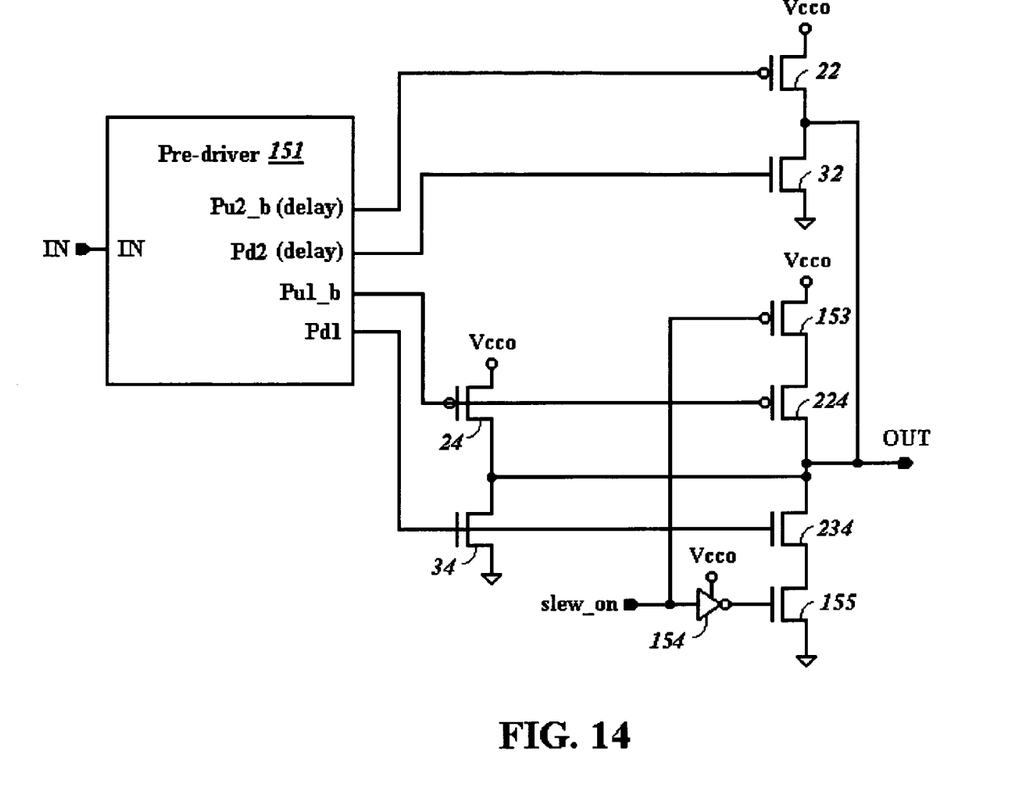
FIG. 14 shows circuitry using a pre-driver according to embodiments of the present invention with slew rate control.

FIG. 14 shows circuitry that can be provided with either the pre-driver of FIG. 11 or FIG. 12 to control slew-rate. As opposed to adding transistors for slew rate control in the pre-driver circuitry, such as in FIGS. 9 and 10, the slew rate control transistors in FIG. 14 are included with the pull-up and pull-down driver transistors. The slew rate control is, thus, more effective since it is not required to overcome the large pull-up and pull-down transistors.

The circuit of FIG. 14 includes pre-driver circuitry 151, which may be the pre-driver circuitry of FIG. 11 or 13. The pre-driver circuitry 151 provides signals to drive DC I/O driver transistors 22 and 32, as well as AC I/O driver transistors 24 and 34. Further an additional AC pull-up transistor 224 and AC pull-down transistor 234 are added for slew rate control. Power is connected by transistors 153 and 155 and inverter 154 that is driven by a slew rate control signal slew_on.

Although the present invention has been described above with particularity, this was merely to teach one of ordinary skill in the art how to make and use the invention. Many additional modifications will fall within the scope of the invention, as that scope is defined by the following claims.

What is claimed is:

1. An I/O driver comprising:
    a first I/O pull-up device;
    a first I/O pull-down device;
    a first delay circuit having a data input for receiving an input data signal, and having an output;
    a first NAND gate having a first input connected to the data input, a second input connected to the output of the first delay circuit, and an output for driving the first I/O pull-up device;
    a first NOR gate having a first input connected to the data input, a second input connected to the output of the first delay circuit, and an output for driving the first I/O pull-down device; and
    level shifters connected to the output of the first NAND gate and the first NOR gate, the level shifters functioning to translate the power supply voltage level from a first level Vdd to a second level Vcco.

2. The I/O driver of claim 1, further comprising:
    a second I/O pull-up device;
    a second I/O pull-down device;
    a second delay circuit having a data input for receiving the input data signal, and having an output, the second delay circuit providing a longer delay than the first delay circuit;
    an second NAND gate having a first input connected to the data input, a second input connected to the output of the second delay circuit, and an output for driving the second I/O pull-up device; and
    an second NOR gate having a first input connected to the data input, a second input connected to the output of the second delay circuit, and an output for driving the second I/O pull-down device.

3. The I/O driver of claim 2, wherein the first delay circuit and the second delay circuit are connected in series.

4. The I/O driver of claim 3,
    wherein the first delay circuit comprises a first plurality of inverters; and
    wherein the second delay circuit comprises a second plurality of inverters.

5. The I/O driver of claim 2,
    wherein the first I/O pull-up device comprises a PMOS transistor having a gate connected to the output of the first NAND gate, a source connected to a power terminal Vcco, and a drain connected to an I/O driver output;
    wherein the first I/O pull-down device comprises an NMOS transistor having a gate connected to the output of the first NOR gate, a common drain with the first I/O pull-up device and a source connected to a ground terminal;

wherein the second I/O pull-up device comprises a PMOS transistor having a gate connected to the output of the second NAND gate, and a source connected the power terminal Vcco, and a drain connected to the I/O driver output; and wherein the second I/O pull-down device comprises an NMOS transistor having a gate connected to the output of the second NOR gate, a common drain with the second I/O pull-up device and a source connected to the ground terminal.

6. The I/O driver of claim 5, further comprising:

a PMOS pull-up control transistor having a source connected to the power terminal Vcco, a gate connected for receiving a slew rate control input, and having a drain;

an NMOS pull-down control transistor having a source connected to the ground terminal, a gate connected by an inverter to receive the slew rate control input, and having a drain;

a third I/O pull-up PMOS transistor having a gate connected to the output of the second NAND gate, a source connected to the drain of the PMOS pull-up control transistor and a drain connected to the I/O driver output; and a third I/O pull-down NMOS transistor having a gate connected to the output of the second NOR gate, a common drain with the third pull-up PMOS transistor, and a source connected to the drain of the NMOS pull-down control transistor.

7. The I/O driver of claim 5, further comprising a level shifter for providing the input data signal, the level shifter translating voltage from a power supply terminal Vdd to the power supply terminal Vcco.

8. An I/O driver comprising:

a first NAND gate having a first input connected to a data input, a second input, and having an output for driving a first I/O pull-up transistor;

an second NAND gate having a first input connected to the data input, a second input, and having an output for driving a second I/O pull-up transistor;

a first NOR gate having a first input connected to the data input, a second input, and having an output for driving a first I/O pull-down transistor;

an second NOR gate having a first input connected to the data input, a second input, and having an output for driving a second I/O pull-down transistor;

a third NAND having a first input connected to the output of the first NAND gate, a second input connected to the output of the second NAND gate, and having an output connected to the second input of the first NOR gate, the output further being connected through a first delay element to the second output of the second NOR gate; and a third NOR gate having a first input connected to the output of the first NOR gate, a second input connected to the output of the second NOR gate, and having an output connected to the second input of the first NAND gate, the output further being connected through a second delay element to the second output of the second NAND gate.

9. The I/O driver of claim 8, wherein the first delay element comprises a first plurality of series connected inverters, and wherein the second delay element comprises a second plurality of series connected inverters.

10. The I/O driver of claim 8, wherein the third NAND gate and the third NOR gate each have a third input, the third input to the NOR gate being provided by a tri-state signal, and the third input to the NAND gate being provided by an inverted form of the tri-state signal.

11. The I/O driver of claim 8, wherein the first I/O pull-up transistor comprises a PMOS transistor having a gate connected to the output of the first NAND gate, a source connected to a power terminal Vcco, and a drain connected to an I/O driver output;

wherein the first I/O pull-down transistor comprises an NMOS transistor having a gate connected to the output of the first NOR gate, a common drain with the first I/O pull-up transistor and a source connected to a ground terminal;

wherein the second I/O pull-up transistor comprises a PMOS transistor having a gate connected to the output of the second NAND gate, and a source connected the power terminal Vcco, and a drain connected to the I/O driver output;

wherein the second I/O pull-down transistor comprises an NMOS transistor having a gate connected to the output of the second NOR gate, a common drain with the second I/O pull-up transistor and a source connected to the ground terminal, wherein the I/O driver further comprises:

a PMOS pull-up control transistor having a sourced connected to the power terminal Vcco, a gate connected for receiving a slew rate control input, and having a drain;

an NMOS pull-down control transistor having a source-connected to the ground terminal, a gate connected by an inverter to receive the slew rate control input, and having a drain;

a third I/O pull-up PMOS transistor having a gate connected to the output of the second NAND gate, a source connected to the drain of the PMOS pull-up control transistor and a drain connected to the I/O driver output; and a third I/O pull-down NMOS transistor having a gate connected to the output of the second NOR gate, a common drain with the third pull-up PMOS transistor, and a source connected to the drain of the NMOS pull-down control transistor.

12. An I/O driver comprising:

a first means for providing a Boolean NAND operation having a first input connected to the data input, a second input, and having an output for driving a first I/O pull-up transistor;

a second means for providing a Boolean NAND operation having a first input connected to the data input, a second input, and having an output for driving a second I/O pull-up transistor;

a first means for providing a Boolean NOR operation having a first input connected to the data input, a second input, and having an output for driving a first I/O pull-down transistor;

an second means for providing a Boolean NOR operation having a first input connected to the data input, a second input, and having an output for driving a second I/O pull-down transistor;

a third means for providing a Boolean NAND operation having a first input connected to the output of the first means for providing a Boolean NAND operation, a second input connected to the output of the second means for providing a Boolean NAND operation, and having an output connected to the second input of the first means for providing a Boolean NOR operation, the output further being connected through a first delay element to the second output of the second means for providing the Boolean NOR operation; and
a third means for providing a Boolean NOR operation having a first input connected to the output of the first means for providing a Boolean NOR operation, a second input connected to the output of the second means for providing a Boolean NOR operation, and having an output connected to the second input of the first means for providing a Boolean NAND operation, the output further being connected through a second delay element to the second output of the second means for providing a Boolean NAND operation.

13. The I/O driver of claim 12, further comprising:
means for providing slew rate control, the slew rate control functioning to add a first slew rate control transistor in parallel with the first pull-up I/O transistor and a second slew rate control transistor in parallel with the first pull-down I/O transistor.

14. The I/O driver of claim 12, further comprising:
means for providing tri-state control by providing a third tri-state enable control input to the third NOR gate and to the third NAND gate.

15. An I/O driver comprising:
a first I/O pull-up device;
a first I/O pull-down device;
a first delay circuit having a data input for receiving an input data signal, and having an output;
a first NAND gate having a first input connected to the data input, a second input connected to the output of the first delay circuit, and an output for driving the first I/O pull-up device;
a first NOR gate having a first input connected to the data input, a second input connected to the output of the first delay circuit, and an output for driving the first I/O pull-down device;
a level shifter for providing the input data signal, the level shifter translating voltage from a power supply terminal Vdd to the power supply terminal Vcco;
a second I/O pull-up device;
a second I/O pull-down device;
a second delay circuit having a data input for receiving the input data signal, and having an output, the second delay circuit providing a longer delay than the first delay circuit;
an second NAND gate having a first input connected to the data input, a second input connected to the output of the second delay circuit, and an output for driving the second I/O pull-up device;
an second NOR gate having a first input connected to the data input, a second input connected to the output of the second delay circuit, and an output for driving the second I/O pull-down device;
wherein the first I/O pull-up device comprises a PMOS transistor having a gate connected to the output of the first NAND gate, a source connected to a Dower terminal Vcco, and a drain connected to an I/O driver output;
wherein the first I/O pull-down device comprises an NMOS transistor having a gate connected to the output of the first NOR gate, a common drain with the first I/O pull-up device and a source connected to a around terminal;
wherein the second I/O pull-up device comprises a PMOS transistor having a gate connected to the output of the second NAND gate, and a source connected the power terminal Vcco, and a drain connected to the I/O driver output;
wherein the second I/O pull-down device comprises an NMOS transistor having a gate connected to the output of the second NOR gate, a common drain with the second I/O pull-up device and a source connected to the ground terminal a PMOS pull-up control transistor having a source connected to the power terminal Vcco, a gate connected for receiving a slew rate control input, and having a drain;
an NMOS pull-down control transistor having a source connected to the ground terminal, a gate connected by an inverter to receive the slew rate control input, and having a drain;
a third I/O pull-up PMOS transistor having a gate connected to the output of the second NAND gate, a source connected to the drain of the PMOS Pull-up control transistor and a drain connected to the I/O driver output; and
a third I/O pull-down NMOS transistor having a gate connected to the output of the second NOR gate, a common drain with the third pull-up PMOS transistor, and a source connected to the drain of the NMOS pull-down control transistor.

16. The I/O driver of claim 15, wherein the first delay circuit and the second delay circuit are connected in series.

17. The I/O driver of claim 16,
wherein the first delay circuit comprises a first plurality of inverters; and
wherein the second delay circuit comprises a second plurality of inverters.

* * * * *